United States Patent
Eun et al.

(10) Patent No.: US 9,779,485 B2
(45) Date of Patent: Oct. 3, 2017

(54) MAGNETIC RESONANCE IMAGING APPARATUS AND METHOD

(71) Applicants: SAMSUNG ELECTRONICS CO., LTD., Suwon-si (KR); KOREA ADVANCED INSTITUTE OF SCIENCE AND TECHNOLOGY, Daejeon-si (KR)

(72) Inventors: Jung-hwi Eun, Suwon-si (KR); Jong Beom Ra, Daejeon (KR)

(73) Assignees: SAMSUNG ELECTRONICS CO., LTD., Suwon-Si (KR); KOREA ADVANCED INSTITUTE OF SCIENCE AND TECHNOLOGY, Daejeon-Si (KR)

( * ) Notice: Subject to any disclaimer, the term of this patent is extended or adjusted under 35 U.S.C. 154(b) by 47 days.

(21) Appl. No.: 14/742,069

(22) Filed: Jun. 17, 2015

(65) Prior Publication Data

US 2016/0027153 A1    Jan. 28, 2016

(30) Foreign Application Priority Data

Jul. 24, 2014   (KR) .................. 10-2014-0094154

(51) Int. Cl.
| | |
|---|---|
| G06K 9/00 | (2006.01) |
| G06T 5/00 | (2006.01) |
| G06T 5/10 | (2006.01) |
| G01R 33/565 | (2006.01) |

(52) U.S. Cl.
CPC ........ *G06T 5/002* (2013.01); *G01R 33/56545* (2013.01); *G06T 5/10* (2013.01); *G06T 2207/10088* (2013.01); *G06T 2207/20056* (2013.01); *G06T 2207/20192* (2013.01); *G06T 2207/30004* (2013.01)

(58) Field of Classification Search
CPC ..................................................... G06T 5/002
See application file for complete search history.

(56) References Cited

U.S. PATENT DOCUMENTS

| | | |
|---|---|---|
| 5,203,765 A | 4/1993 | Friddle, Jr. |
| 5,285,157 A | 2/1994 | Zur |
| 5,779,636 A | 7/1998 | Kanazawa |
| 7,227,356 B1 | 6/2007 | Hariharan et al. |
| 2003/0004563 A1 | 1/2003 | Jackson et al. |
| 2007/0102641 A1 | 5/2007 | Schmand et al. |
| 2007/0161890 A1 | 7/2007 | Hariharan et al. |
| 2008/0049376 A1 | 2/2008 | Stevenson et al. |
| 2008/0228063 A1 | 9/2008 | Turner et al. |
| 2011/0116699 A1 | 5/2011 | Roy et al. |
| 2011/0230755 A1 | 9/2011 | MacFarlane et al. |

(Continued)

*Primary Examiner* — Oneal R Mistry
(74) *Attorney, Agent, or Firm* — Sughrue Mion, PLLC

(57) ABSTRACT

A magnetic resonance imaging (MRI) apparatus and an MRI method are provided. The MRI apparatus includes a data acquisition unit configured to acquire a first image by performing an MRI scan on an object. The MRI apparatus further includes an image acquisition unit configured to acquire a second image by performing de-noising filtering on the first image in a spatial domain, acquire a third image based on the first image and the second image, acquire a fourth image by performing low-pass filtering on the third image in a frequency domain, and acquire a final image based on the second image and the fourth image.

23 Claims, 9 Drawing Sheets

(56) References Cited

U.S. PATENT DOCUMENTS

2011/0268328 A1* 11/2011 Bar-Aviv .................. G06T 5/50
382/128
2012/0146641 A1 6/2012 Wu et al.
2012/0269414 A1* 10/2012 Zha ......................... G06T 5/002
382/131

* cited by examiner

MAGNETIC RESONANCE IMAGING APPARATUS AND METHOD

CROSS-REFERENCE TO RELATED APPLICATION

This application claims priority from Korean Patent Application No. 10-2014-0094154, filed on Jul. 24, 2014, in the Korean Intellectual Property Office, the disclosure of which is incorporated herein in its entirety by reference.

BACKGROUND

1. Field

Apparatuses and methods consistent with exemplary embodiments relate to a magnetic resonance imaging (MRI) apparatus and an MRI method.

2. Description of the Related Art

An MRI apparatus uses a magnetic field to capture an image of a subject, and is widely used in the accurate diagnosis of diseases because it shows stereoscopic images of bones, lumbar discs, joints, and nerve ligaments at desired angles. The MRI apparatus is configured to acquire MR signals and reconstruct the acquired MR signals into an image to be output. Specifically, the MRI apparatus acquires MR signals by using radio frequency (RF) coils, a permanent magnet, and gradient coils.

When an MR signal is acquired, unmeasured signals may be generated at junctions between RF coils. Furthermore, errors may occur when acquiring an MR signal. Due to the presence of unmeasured signals and errors in signal acquisition, artifacts or noise may occur in reconstructing a final MR image. The artifacts or noise present in an MR image may degrade the quality of the MR image. Thus, various techniques are being developed to remove artifacts or noise in an MR image. Examples of the techniques may include the use of a filter, a specialized recovery method to remove Gibbs ringing effects (e.g., a Gegenbauer reconstruction algorithm), and the like.

In detail, according to the filtering method, ringing artifacts may be mitigated by reducing high frequency components using a low-pass filter in the frequency domain. The specialized recovery method may include a Gegenbauer reconstruction algorithm that uses the sum of non-periodic segments of a Fourier series.

However, the filtering method using a low-pass filter has a drawback in that high frequency signal components of the original image are also removed when filtering the entire image signal. Thus, the use of a low-pass filter may result in the deterioration of the original image. In other words, if a low-pass filter is used to remove ringing artifacts, an edge of an image may be blurred, and a detail of the image containing critical information may become unclear.

As another approach for reducing ringing artifacts, a Gegenbauer reconstruction algorithm is extremely complicated, and requires long reconstruction time due to iterative computations. The algorithm has another drawback in that a detail of a generated MR image may not clearly represent an object being analyzed.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments include a magnetic resonance imaging (MRI) apparatus and an MRI method that are capable of removing artifacts in an MR image, and in particular, an MRI apparatus and an MRI method that are capable of quickly and easily removing ripple artifacts present in an MR image without losing high frequency signal components.

According to an aspect of an exemplary embodiment, an MRI apparatus includes a data acquisition unit configured to acquire a first image by performing an MRI scan on an object, and an image acquisition unit configured to acquire a second image by performing de-noising filtering on the first image in a spatial domain, acquire a third image based on the first image and the second image, acquire a fourth image by performing low-pass filtering on the third image in a frequency domain, and acquire a final image based on the second image and the fourth image.

The de-noising filtering may be edge preserving de-noising filtering, and the image acquisition unit may include a spatial domain processor configured to acquire the second image by performing the edge preserving de-noising filtering on the first image in the spatial domain.

The edge preserving de-noising filtering may include any one or any combination of bilateral filtering, anisotropic filtering, block-matching and three-dimensional filtering, and non-local means filtering.

The spatial domain processor may include an edge preserving de-noise filter configured to perform the edge preserving de-noising filtering on the first image in the spatial domain to acquire the second image, a residual image acquisition unit configured to acquire the third image based on the first image and the second image, and a domain transform unit configured to convert the third image from the spatial domain into the frequency domain.

The residual image acquisition unit may be configured to acquire the third image by subtracting the second image from the first image.

The domain transform unit may be configured to apply a Fourier transform or a Fast Fourier transform to the third image to convert the third image from the spatial domain into the frequency domain.

The image acquisition unit may further include a frequency domain processor configured to acquire the fourth image by performing the low-pass filtering on the third image in the frequency domain to remove ringing artifacts in the third image.

The frequency domain processor may include a low-pass filter configured to perform the low-pass filtering on the third image converted into the frequency domain to acquire the fourth image, and a domain inverse transform unit configured to convert the fourth image from the frequency domain into the spatial domain.

The image acquisition unit may further include a final image acquisition unit configured to acquire the final image by adding the second image and the fourth image converted into the spatial domain.

According to an aspect of an exemplary embodiment, there is provided a magnetic resonance imaging (MRI) apparatus including a data acquisition unit configured to acquire a first image by performing an MRI scan on an object, and an image acquisition unit configured to acquire a second image by performing first filtering on the first image in a spatial domain, acquire a third image by subtracting the second image from the first image, acquire a fourth image by performing second filtering on the third image in a frequency domain, and acquire a final image based on the second image and the fourth image.

The first filtering may be edge preserving de-noising filtering.

The second filtering may be low-pass filtering.

According to an aspect of an exemplary embodiment, there is provided a magnetic resonance imaging (MRI) method including acquiring a first image by performing an MRI scan on an object, acquiring a second image by performing de-noising filtering on the first image in a spatial domain, acquiring a third image based on the first image and the second image, acquiring a fourth image by performing low-pass filtering on the third image in a frequency domain, and acquiring a final image based on the second image and the fourth image.

The acquiring the second image may include acquiring the second image by performing edge preserving de-noising filtering on the first image in the spatial domain.

The acquiring the third image may include acquiring the third image by subtracting the second image from the first image.

The acquiring the third image may include converting the third image from the spatial domain into the frequency domain.

The converting the third image may include applying a Fourier transform or Fast Fourier transform to the third image.

The acquiring the fourth image may include acquiring the fourth image by performing the low-pass filtering on the third image converted into the frequency domain, and converting the fourth image from the frequency domain into the spatial domain.

The acquiring the final image may include acquiring the final image by adding the second image and the fourth image converted into the spatial domain.

The acquiring the fourth image may include acquiring the fourth image by performing the low-pass filtering on the third image in the frequency domain to remove ringing artifacts in the third image.

A non-transitory computer-readable storage medium may store a program including instructions to cause a computer to perform the method.

According to an aspect of an exemplary embodiment, there is provided a magnetic resonance imaging (MRI) apparatus including a spatial domain processor configured to filter an MRI image in a spatial domain to generate a first filtered image, and generate a ringing artifacts image based on the first filtered image and the MRI image. The MRI apparatus further includes a frequency domain processor configured to filter the ringing artifacts image in a frequency domain to generate a second filtered image, and a final image acquisition unit configured to acquire a final image based on the first filtered image and the second filtered image.

The spatial domain processor may be configured to perform edge preserving de-noise filtering on the MRI image in the spatial domain to generate the first filtered image, subtract the first filtered image from the MRI image to generate the ringing artifacts image, and convert the ringing artifacts image from the spatial domain into the frequency domain.

The frequency domain processor may be configured to perform low-pass filtering on the converted ringing artifacts image in the frequency domain to generate the second filtered image, and convert the second filtered image from the frequency domain into the spatial domain.

BRIEF DESCRIPTION OF THE DRAWINGS

The above and/or other aspects will become apparent by describing certain exemplary embodiments, with reference to the accompanying drawings, in which.

DETAILED DESCRIPTION

Figure 1:
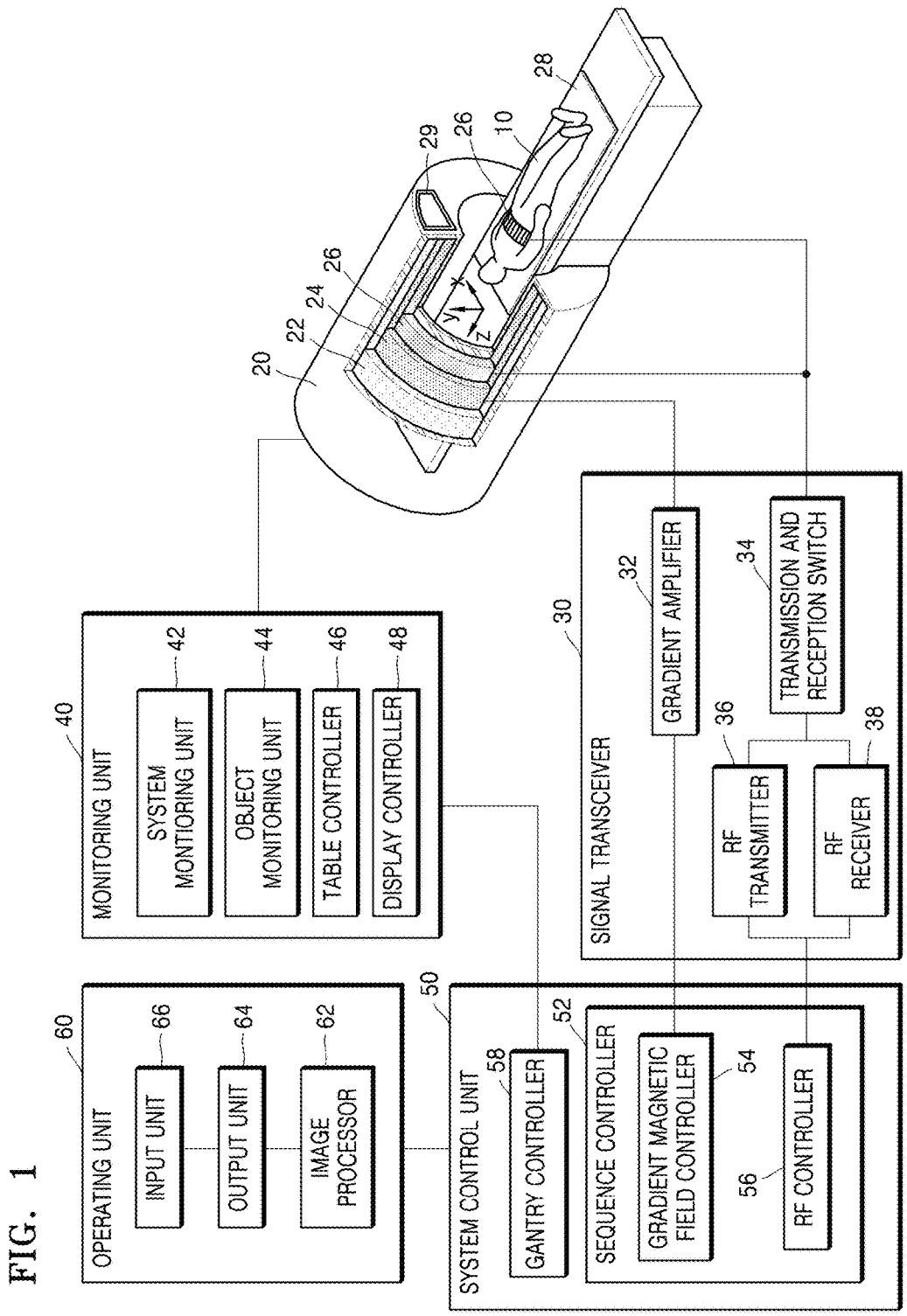
FIG. 1 is a schematic diagram of a magnetic resonance imaging (MRI) system.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

Throughout the specification, it will be understood that when a component "includes" an element, unless there is another opposite description thereto, it should be understood that the component does not exclude another element and may further include another element. Also, the term "unit" in the exemplary embodiments means a software component or hardware component such as a field-programmable gate array (FPGA) or an application-specific integrated circuit (ASIC), and performs a specific function. However, the term "unit" is not limited to software or hardware. The "unit" may be formed so as to be in an addressable storage medium, or may be formed so as to operate one or more processors. Thus, for example, the term "unit" may refer to components such as software components, object-oriented software components, class components, and task components, and may include processes, functions, attributes, procedures, subroutines, segments of program code, drivers, firmware, micro codes, circuits, data, a database, data structures, tables, arrays, or variables. A function provided by the components and "units" may be associated with the smaller number of components and "units", or may be divided into additional components and "units".

Throughout the specification, an "image" may refer to multi-dimensional data composed of discrete image elements (e.g., pixels in a two-dimensional (2D) image and voxels in a three-dimensional (3D) image). For example, an image may be a medical image of an object acquired by an X-ray apparatus, a computed tomography (CT) apparatus, a magnetic resonance imaging (MRI) apparatus, an ultrasound diagnosis apparatus, or another medical imaging apparatus.

Furthermore, throughout the specification, an "object" may be a human, an animal, or a part of a human or animal. For example, the object may be an organ (e.g., the liver, the heart, the womb, the brain, a breast, or the abdomen), a blood vessel, or a combination thereof. Furthermore, the "object" may be a phantom. The phantom means a material having a density, an effective atomic number, and a volume that are approximately the same as those of an organism. For example, the phantom may be a spherical phantom having properties similar to the human body.

Furthermore, throughout the specification, a "user" may be, but is not limited to, a medical expert, such as a medical doctor, a nurse, a medical laboratory technologist, or a technician who repairs a medical apparatus.

Furthermore, throughout the specification, an "MR image" refers to an image of an object obtained by using the nuclear magnetic resonance principle.

Furthermore, throughout the specification, a "pulse sequence" refers to a continuity of signals repeatedly applied by an MRI apparatus. The pulse sequence may include a time parameter of a radio frequency (RF) pulse, for example, repetition time (TR) or echo time (TE).

Furthermore, throughout the specification, a "pulse sequence schematic diagram" shows an order of events that occur in an MRI apparatus. For example, the pulse sequence schematic diagram may be a diagram showing an RF pulse, a gradient magnetic field, an MR signal, or the like, according to time.

An MRI system is an apparatus for acquiring a sectional image of a part of an object by expressing, in a contrast comparison, a strength of a MR signal with respect to a radio frequency (RF) signal generated in a magnetic field having a strength. For example, if an RF signal that only resonates an atomic nucleus (for example, a hydrogen atomic nucleus) is emitted for an instant toward the object placed in a strong magnetic field and then such emission stops, an MR signal is emitted from the atomic nucleus, and thus the MRI system may receive the MR signal and acquire an MR image. The MR signal denotes an RF signal emitted from the object. An intensity of the MR signal may be determined according to a density of a predetermined atom (for example, hydrogen) of the object, a relaxation time T1, a relaxation time T2, a flow of blood, or the like.

MRI systems include characteristics different from those of other imaging apparatuses. Unlike imaging apparatuses such as CT apparatuses that acquire images according to a direction of detection hardware, MRI systems may acquire 2D images or 3D volume images that are oriented toward an optional point. MRI systems do not expose objects or examiners to radiation, unlike CT apparatuses, X-ray apparatuses, position emission tomography (PET) apparatuses, and single photon emission CT (SPECT) apparatuses, may acquire images having high soft tissue contrast, and may acquire neurological images, intravascular images, musculoskeletal images, and oncologic images that are required to precisely capturing abnormal tissues.

FIG. 1 is a block diagram of an MRI system. Referring to FIG. 1, the MRI system includes a gantry 20, a signal transceiver 30, a monitoring unit 40, a system control unit 50, and an operating unit 60.

The gantry 20 prevents external emission of electromagnetic waves generated by a main magnet 22, a gradient coil 24, and an RF coil 26. A magnetostatic field and a gradient magnetic field are formed in a bore in the gantry 20, and an RF signal is emitted toward an object 10.

The main magnet 22, the gradient coil 24, and the RF coil 26 may be arranged in a predetermined direction of the gantry 20. The predetermined direction may be a coaxial cylinder direction. The object 10 may be disposed on a table 28 that is capable of being inserted into a cylinder along a horizontal axis of the cylinder.

The main magnet 22 generates a magnetostatic field or a static magnetic field for aligning magnetic dipole moments of atomic nuclei of the object 10 in a constant direction. A precise and accurate MR image of the object 10 may be obtained due to a magnetic field generated by the main magnet 22 being strong and uniform.

The gradient coil 24 includes X, Y, and Z coils for generating gradient magnetic fields in X-, Y-, and Z-axis directions crossing each other at right angles. The gradient coil 24 may provide location information of each region of the object 10 by differently inducing resonance frequencies according to the regions of the object 10.

The RF coil 26 emits an RF signal toward a patient, and receives an MR signal emitted from the patient. In detail, the RF coil 26 may transmit, toward atomic nuclei included in the patient and having precessional motion, an RF signal having the same frequency as that of the precessional motion, stop transmitting the RF signal, and then receive an MR signal emitted from the atomic nuclei included in the patient.

For example, in order to transit an atomic nucleus from a low energy state to a high energy state, the RF coil 26 may generate and apply an electromagnetic wave signal that is an RF signal corresponding to a type of the atomic nucleus, to the object 10. When the electromagnetic wave signal generated by the RF coil 26 is applied to the atomic nucleus, the atomic nucleus may transit from the low energy state to the high energy state. Then, when electromagnetic waves generated by the RF coil 26 disappear, the atomic nucleus to which the electromagnetic waves were applied transits from the high energy state to the low energy state, thereby emitting electromagnetic waves having a Lamor frequency. In other words, when the applying of the electromagnetic wave signal to the atomic nucleus is stopped, an energy level of the atomic nucleus is changed from a high energy level to a low energy level, and thus the atomic nucleus may emit electromagnetic waves having a Lamor frequency. The RF coil 26 may receive electromagnetic wave signals from atomic nuclei included in the object 10.

The RF coil 26 may be realized as one RF transmitting and receiving coil having both a function of generating electromagnetic waves each having an RF that corresponds to a type of an atomic nucleus and a function of receiving electromagnetic waves emitted from an atomic nucleus. Alternatively, the RF coil 26 may be realized as a transmission RF coil having a function of generating electromagnetic waves each having an RF that corresponds to a type of an atomic nucleus, and a reception RF coil having a function of receiving electromagnetic waves emitted from an atomic nucleus.

The RF coil 26 may be fixed to the gantry 20 or may be detachable. When the RF coil 26 is detachable, the RF coil 26 may be an RF coil for a part of the object, such as a head RF coil, a chest RF coil, a leg RF coil, a neck RF coil, a shoulder RF coil, a wrist RF coil, or an ankle RF coil.

The RF coil 26 may communicate with an external apparatus via wires and/or wirelessly, and may also perform dual tune communication according to a communication frequency band. The RF coil 26 may communicate with an external apparatus via wires and/or wirelessly, and may also perform dual tune communication according to a communication frequency band.

The RF coil 26 may be a transmission exclusive coil, a reception exclusive coil, or a transmission and reception coil according to methods of transmitting and receiving an RF signal.

The RF coil 26 may be an RF coil having various numbers of channels, such as 16 channels, 32 channels, 72 channels, and 144 channels.

The gantry 20 further includes a display 29 disposed outside the gantry 20, and may include a display disposed inside the gantry 20. The gantry 20 may provide predetermined information to the user or the object 10 through the display 29 and the display respectively disposed inside the gantry 20.

The signal transceiver 30 controls the gradient magnetic field formed inside the gantry 20, i.e., in the bore, according to a predetermined MR sequence, and controls transmission and reception of an RF signal and an MR signal. The signal transceiver 30 includes a gradient amplifier 32, a transmission and reception switch 34, an RF transmitter 36, and an RF receiver 38.

The gradient amplifier 32 drives the gradient coil 24 included in the gantry 20, and supplies a pulse signal for generating a gradient magnetic field to the gradient coil 24 under the control of a gradient magnetic field controller 54. By controlling the pulse signal supplied from the gradient amplifier 32 to the gradient coil 24, gradient magnetic fields in X-, Y-, and Z-axis directions may be synthesized.

The RF transmitter 36 and the RF receiver 38 drive the RF coil 26. The RF transmitter 36 may supply an RF pulse in a Lamor frequency to the RF coil 26, and the RF receiver 38 may receive an MR signal received by the RF coil 26.

The transmission and reception switch 34 adjusts transmitting and receiving directions of the RF signal and the MR signal. For example, the transmission and reception switch 34 may emit the RF signal toward the object 10 through the RF coil 26 during a transmission mode, and receive the MR signal from the object 10 through the RF coil 26 during a reception mode. The transmission and reception switch 34 is controlled by a control signal output by an RF controller 56.

The monitoring unit 40 monitors and controls the gantry 20 or devices mounted on the gantry 20. The monitoring unit 40 includes a system monitoring unit 42, an object monitoring unit 44, a table controller 46, and a display controller 48.

The system monitoring unit 42 monitors and controls a state of the magnetostatic field, a state of the gradient magnetic field, a state of the RF signal, a state of the RF coil 26, a state of the table 28, a state of a device measuring body information of the object 10, a power supply state, a state of a thermal exchanger, and a state of a compressor.

The object monitoring unit 44 monitors a state of the object 10. In detail, the object monitoring unit 44 may include a camera for observing a movement or position of the object 10, a respiration measurer for measuring the respiration of the object 10, an electrocardiogram (ECG) measurer for measuring the electrical activity of the object 10, and a temperature measurer for measuring a temperature of the object 10.

The table controller 46 controls a movement of the table 28 where the object 10 is positioned. The table controller 46 may control the movement of the table 28 according to a sequence control of a sequence controller 52. For example, during moving imaging of the object 10, the table controller 46 may continuously or discontinuously move the table 28 according to the sequence control of the sequence controller 52, and thus the object 10 may be imaged in a field of view (FOV) larger than that of the gantry 20.

The display controller 48 controls the display 29 disposed outside the gantry 20 and the display disposed inside the gantry 20. In detail, the display controller 48 may control the display 29 and the display to be on or off, and may control a screen image to be output on the display 29 and the display. Also, when a speaker is located inside or outside the gantry 20, the display controller 48 may control the speaker to be on or off, or may control sound to be output via the speaker.

The system control unit 50 includes the sequence controller 52 for controlling a sequence of signals formed in the gantry 20, and a gantry controller 58 for controlling the gantry 20 and the devices mounted on the gantry 20.

The sequence controller 52 includes the gradient magnetic field controller 54 for controlling the gradient amplifier 32, and the RF controller 56 for controlling the RF transmitter 36, the RF receiver 38, and the transmission and reception switch 34. The sequence controller 52 may control the gradient amplifier 32, the RF transmitter 36, the RF receiver 38, and the transmission and reception switch 34 according to a pulse sequence received from the operating unit 60. Here, the pulse sequence includes all information required to control the gradient amplifier 32, the RF transmitter 36, the RF receiver 38, and the transmission and reception switch 34. For example, the pulse sequence may include information about a strength, an application time, and application timing of a pulse signal applied to the gradient coil 24.

The operating unit 60 may request the system control unit 50 to transmit pulse sequence information while controlling an overall operation of the MRI system. The operating unit 60 includes an image processor 62 for receiving and processing the MR signal received by the RF receiver 38, an output unit 64, and an input unit 66.

The image processor 62 processes the MR signal received from the RF receiver 38 so as to generate MR image data of the object 10. The image processor 62 receives the MR signal received by the RF receiver 38, and performs any one of various signal processes, such as amplification, frequency transformation, phase detection, low frequency amplification, and filtering, on the received MR signal.

The image processor 62 may arrange digital data in a k space (for example, also referred to as a Fourier space or a frequency space) of a memory, and rearrange the digital data into image data via 2D or 3D Fourier transformation.

The image processor 62 may perform a composition process or difference calculation process on image data if required. The composition process may include an addition process on a pixel or a maximum intensity projection (MIP) process. The image processor 62 may store not only the rearranged image data but also image data on which a composition process or a difference calculation process is performed, in a memory (not shown) or an external server.

The image processor 62 may perform any of the signal processes on the MR signal in parallel. For example, the image processor 62 may perform a signal process on a plurality of MR signals received by a multi-channel RF coil in parallel so as to rearrange the plurality of MR signals into image data.

The output unit 64 outputs image data generated or rearranged by the image processor 62 to the user. The output unit 64 may also output information required for the user to manipulate the MRI system, such as a user interface (UI), user information, or object information. Examples of the output unit 64 may include a speaker, a printer, a cathode ray tube (CRT) display, a liquid crystal display (LCD), a plasma display panel (PDP), an organic light emitting diode (OLED) display, a field emission display (FED), a light emitting diode (LED) display, a vacuum fluorescent display (VFD), a digital light processing (DLP) display, a flat panel display (PFD), a three-dimensional (3D) display, a transparent display, and other various output devices well known to one of ordinary skill in the art.

The user may input object information, parameter information, a scan condition, a pulse sequence, and information about image composition or difference calculation by using the input unit 66. The input unit 66 may be a keyboard, a mouse, a track ball, a voice recognizer, a gesture recognizer, a touch screen, or any one of other various input devices that are well known to one of ordinary skill in the art.

The signal transceiver 30, the monitoring unit 40, the system control unit 50, and the operating unit 60 are separate components in FIG. 1, but it will be obvious to one of ordinary skill in the art that respective functions of the signal transceiver 30, the monitoring unit 40, the system control unit 50, and the operating unit 60 may be performed by another component. For example, the image processor 62 converts the MR signal received from the RF receiver 38 into a digital signal in FIG. 1, but alternatively, the conversion of the MR signal into the digital signal may be performed by the RF receiver 38 or the RF coil 26.

The gantry 20, the RF coil 26, the signal transceiver 30, the monitoring unit 40, the system control unit 50, and the operating unit 60 may be connected to each other by wire or wirelessly, and when they are connected wirelessly, the MRI system may further include an apparatus (not shown) for synchronizing clock signals therebetween. Communication between the gantry 20, the RF coil 26, the signal transceiver 30, the monitoring unit 40, the system control unit 50, and the operating unit 60 may be performed by using a high-speed digital interface, such as low voltage differential signaling (LVDS), asynchronous serial communication, such as a universal asynchronous receiver transmitter (UART), a low-delay network protocol, such as error synchronous serial communication or a controller area network (CAN), optical communication, and any of other various communication methods that are well known to one of ordinary skill in the art.

Figure 2:
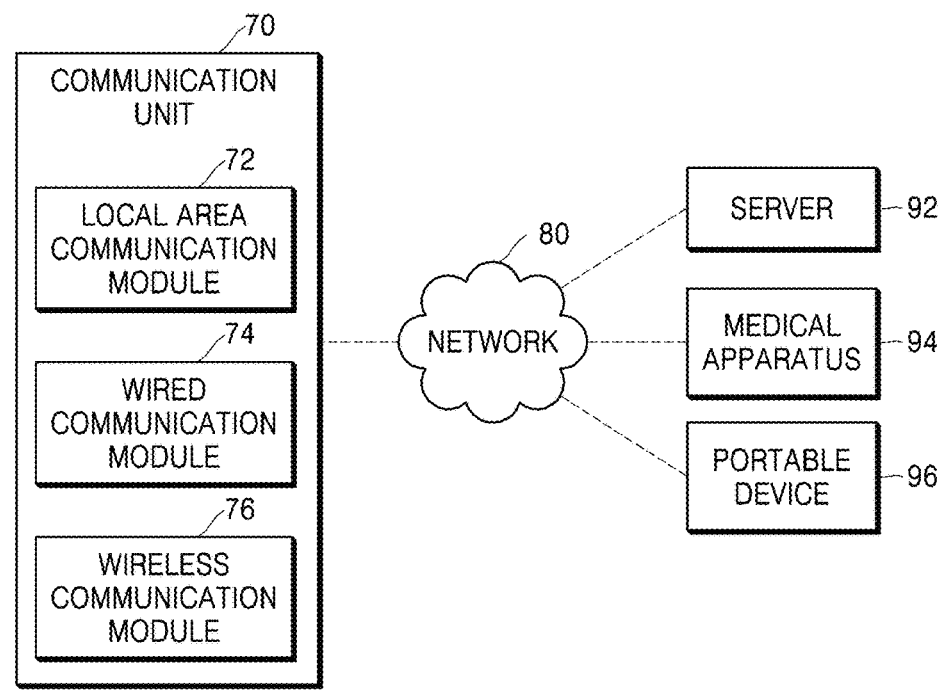
FIG. 2 is a block diagram of a communication unit.

FIG. 2 is a block diagram of a communication unit 70. Referring to FIG. 2, the communication unit 70 may be connected to at least one selected from the gantry 20, the signal transceiver 30, the monitoring unit 40, the system control unit 50, and the operating unit 60 of FIG. 1.

The communication unit 70 may transmit and receive data to and from a hospital server or another medical apparatus in a hospital, which is connected through a picture archiving and communication system (PACS), and perform data communication according to the digital imaging and communications in medicine (DICOM) standard.

As shown in FIG. 2, the communication unit 70 may be connected to a network 80 by wire or wirelessly to communicate with a server 92, a medical apparatus 94, and a portable device 96.

In detail, the communication unit 70 may transmit and receive data related to the diagnosis of an object through the network 80, and may also transmit and receive a medical image captured by the medical apparatus 94, such as a CT apparatus, an MRI apparatus, or an X-ray apparatus. In addition, the communication unit 70 may receive a diagnosis history or a treatment schedule of the object from the server 92 and use the same to diagnose the object. The communication unit 70 may perform data communication not only with the server 92 or the medical apparatus 94 in a hospital, but also with the portable device 96, such as a mobile phone, a personal digital assistant (PDA), or a laptop of a doctor or patient.

Also, the communication unit 70 may transmit information about a malfunction of the MRI system or about a medical image quality to a user through the network 80, and receive a feedback regarding the information from the user.

The communication unit 70 may include at least one component enabling communication with an external apparatus. In this example, the communication unit 70 includes a local area communication module 72, a wired communication module 74, and a wireless communication module 76. The local area communication module 72 refers to a module for performing local area communication with an apparatus within a predetermined distance. Examples of local area communication technology according to exemplary embodiments include, but are not limited to, a wireless local area network (LAN), Wi-Fi, Bluetooth, ZigBee, Wi-Fi direct (WFD), ultra wideband (UWB), infrared data association (IrDA), Bluetooth low energy (BLE), and near field communication (NFC).

The wired communication module 74 refers to a module for performing communication by using an electric signal or an optical signal. Examples of wired communication technology include wired communication techniques using a pair cable, a coaxial cable, and an optical fiber cable, and other well-known wired communication techniques.

The wireless communication module 76 transmits and receives a wireless signal to and from at least one selected from a base station, an external apparatus, and a server in a mobile communication network. Here, the wireless signal may be a voice call signal, a video call signal, or data in any one of various formats according to transmission and reception of a text/multimedia message.

Figure 3:
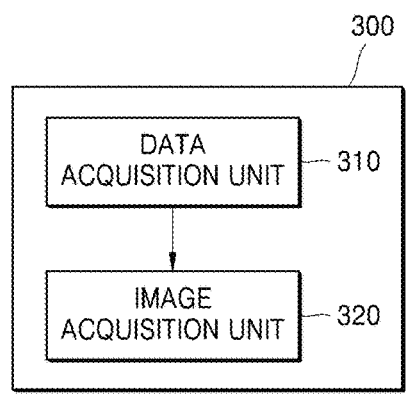
FIG. 3 is a block diagram of an MRI apparatus according to an exemplary embodiment.

FIG. 3 is a block diagram of an MRI apparatus 300 according to an exemplary embodiment.

The MRI apparatus 300 may include the image processor 62 described with reference to FIG. 1. The MRI apparatus 300 may be included in the medical apparatus 94 or the portable device 96 described with reference to FIG. 2 to connect to the MRI system of FIG. 1 for operating the same. The MRI apparatus 300 may be implemented as an independent computing device.

Referring to FIG. 3, the MRI apparatus 300 includes a data acquisition unit 310 and an image acquisition unit 320. The data acquisition unit 310 acquires a first image by performing an MRI scan on an object.

The image acquisition unit 320 performs de-noising filtering on the first image in the spatial domain to generate a second image. The image acquisition unit 320 also performs low-pass filtering on a third image in the frequency domain, which is generated based on the first and second images, thereby generating a fourth image. Then, the image acquisition unit 320 acquires a final image based on the second and fourth images.

In detail, the data acquisition unit 310 may receive an MR signal to generate a first image, or receive a first image from the outside. In this case, the first image may be an MR image that has not undergone a process of removing artifacts or noise from the MR image.

An MR image may be restored by using a plurality of data acquired by the RF coil 26 (included in the MRI system of FIG. 1) that is an RF multi-coil including a plurality of channel coils. In detail, the MRI apparatus 300 may generate an MR image by using a plurality of data received via the RF coil 26. In this case, the plurality of data received via the RF coil 26 may be raw data generated in a K-space. The raw data is a signal produced by arranging in the K-space an RF signal received from each of the channel coils included in the RF multi-coil. An MRI method is a technique for restoring an MR image using raw data. Examples of the MRI method for processing an acquired MR signal include a Generalized Auto-calibrating Partially Parallel Acquisition (GRAPPA) technique based on a K-space, a sensitivity encoding (SENSE) technique, and the like.

In this case, the first image may be an MR image generated by applying an MRI method to raw data that is an MR signal acquired via the RF coil 26. Furthermore, the first image may be an MR image that has not undergone image processing performed by the image acquisition unit 320.

A detailed operation of the MRI apparatus 300 will now be described in more detail with reference to FIGS. 4 through 6.

Figure 4:
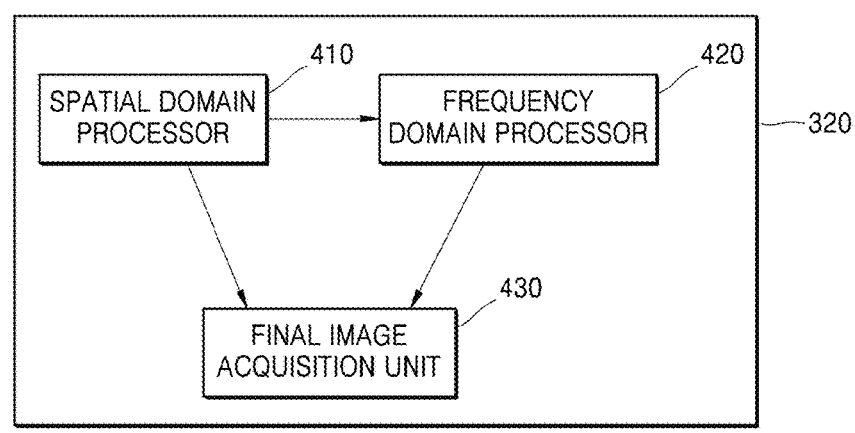
FIG. 4 is a block diagram of an image acquisition unit shown in FIG. 3.

FIG. 4 is a block diagram of the image acquisition unit 320 shown in FIG. 3. Referring to FIG. 4, the image acquisition unit 320 includes a spatial domain processor 410, a frequency domain processor 420, and a final image acquisition unit 430.

The spatial domain processor 410 performs edge preserving de-noising filtering on a first image in the spatial domain to generate a second image. In detail, the spatial domain processor 410 performs image processing based on pixel values of an image.

The frequency domain processor 420 performs low-pass filtering on a third image, and removes ringing artifacts present in the third image, to generate a fourth image.

The final image acquisition unit 430 adds the second and fourth images together to generate a final image.

Operations of the spatial domain processor 410, the frequency domain processor 420, and the final image acquisition unit 430 will now be described in more detail with reference to FIGS. 5 and 6.

Figure 5:
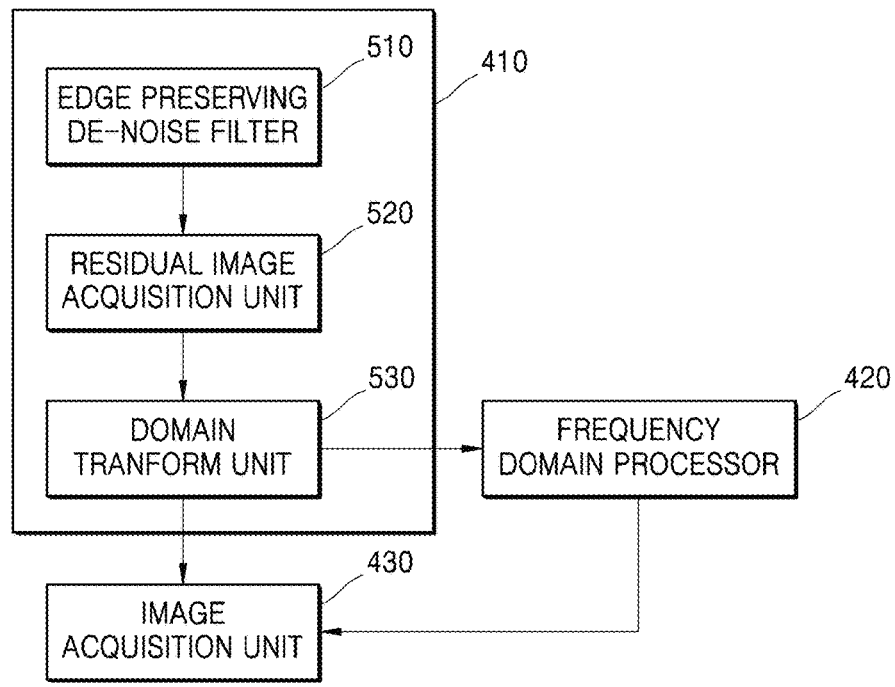
FIG. 5 is a block diagram of a spatial domain processor shown in FIG. 4.

FIG. 5 is a block diagram of the spatial domain processor 410 shown in FIG. 4. The spatial domain processor 410 processes an image in the spatial domain.

In detail, referring to FIG. 5, the spatial domain processor 410 includes an edge preserving de-noise filter 510, a residual image acquisition unit 520, and a domain transform unit 530.

The edge preserving de-noise filter 510 is a filter used to remove noise while preserving edges. In detail, by processing an image in the spatial domain, the edge preserving de-noise filter 510 may distinguish edges that delineate a boundary of an object in the image from noise in the image to selectively remove only the noise. For example, the edge preserving de-noise filter 510 may include at least one selected from a bilateral filter, an anisotropic filter, a block-matching and 3D filter, and a non-local means filter.

The edge preserving de-noise filter 510 may acquire a second image having preserved edges and reduced noise from the first image received from the data acquisition unit 310.

The residual image acquisition unit 520 acquires a third image based on the first and second images. In detail, the third image may be obtained by subtracting the second image from the first image. The third image may be an image including only ringing artifacts and various noise present in the first image.

The domain transform unit 530 converts an image in the spatial domain into an image in the frequency domain. For example, the third image in the spatial domain may be output from the residual image acquisition unit 520, be fed into the domain transform unit 530, and be converted into a third image in the frequency domain. The third image in the frequency domain may be output to the final image acquisition unit 430 or the frequency domain processor 420. The domain transform unit 530 may use Fourier Transform (FT), Fast Fourier Transform (FFT), or any other transformation technique for converting pixel values in an image into frequency values.

Figure 6:
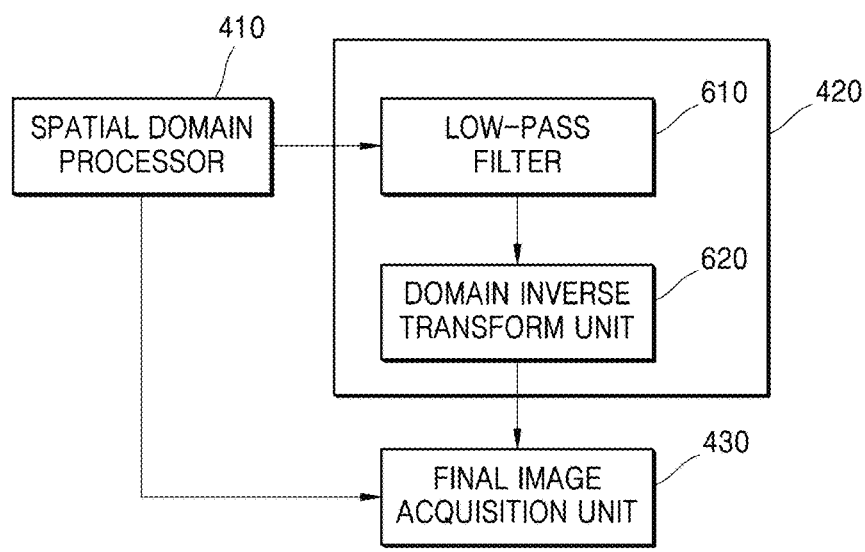
FIG. 6 is a block diagram of a frequency domain processor shown in FIG. 4.

FIG. 6 is a block diagram of the frequency domain processor 420 shown in FIG. 4. The frequency domain processor 420 processes an image in the frequency domain, and includes a low-pass filter 610 and a domain inverse transform unit 620.

The low-pass filter 610 filters out signal values having frequencies above a filtering frequency among signal values in an image while passing signal values having frequencies less than or equal to the filtering frequency among the signal values in the image. In detail, the low-pass filter 610 receives the third image in the frequency domain output from the domain transform unit 530, and outputs a fourth image by filtering out signal values having frequencies above a filtering frequency from the third image. In this case, the filtering frequency may be set according to a range of frequencies that is to be filtered by the low-pass filter 610.

The domain inverse transform unit 620 converts an image from the frequency domain back into the spatial domain. For example, the domain inverse transform unit 620 may convert the fourth image received from the low-pass filter 610 back into the spatial domain, thereby outputting the fourth image converted into the spatial domain. The fourth image in the spatial domain is then output to the final image acquisition unit 430.

Figure 7:
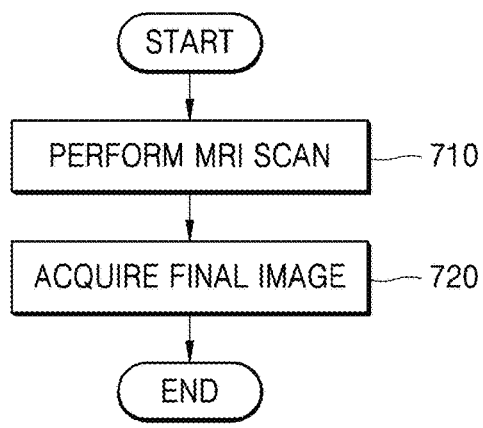
FIG. 7 is a flowchart of an MRI method according to an exemplary embodiment.

FIG. 7 is a flowchart of an MRI method capable of reducing ringing artifacts according to an exemplary embodiment.

Referring to FIG. 7, in operation 710, the MRI method includes performing an MRI scan. Operation 710 may include acquiring a first image by performing an MRI scan on an object.

In operation 720, the MRI method includes acquiring a final image. In detail, a second image is generated by performing de-noising filtering on the first image in the spatial domain. For example, the second image may be acquired by applying edge preserving de-noising filtering to the first image. A third image is acquired based on the first and second images. For example, the third image may be obtained by subtracting the second image from the first image. Furthermore, the third image is low-pass filtered in the frequency domain to generate a fourth image. Lastly, a final image is acquired based on the second and fourth images.

Figure 8:
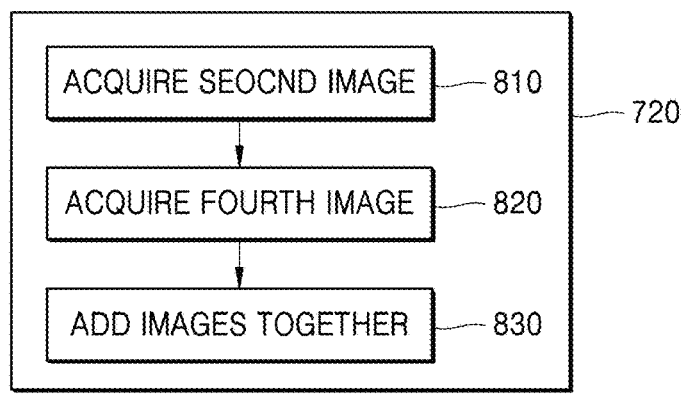
FIG. 8 is a flowchart of an operation of acquiring a final image that is shown in FIG. 7.

FIG. 8 is a flowchart of operation 720 shown in FIG. 7 in more detail. Referring to FIG. 8, operation 720 includes acquiring a second image (operation 810), acquiring a fourth image (operation 820), and adding the second and fourth images together (operation 830). In operation 810, edge preserving de-noising filtering may be performed on the first image in the spatial domain to generate the second image. In operation 820, the fourth image may be generated by performing low-pass filtering on a third image, and removing ringing artifacts present in the third image.

Figure 9:
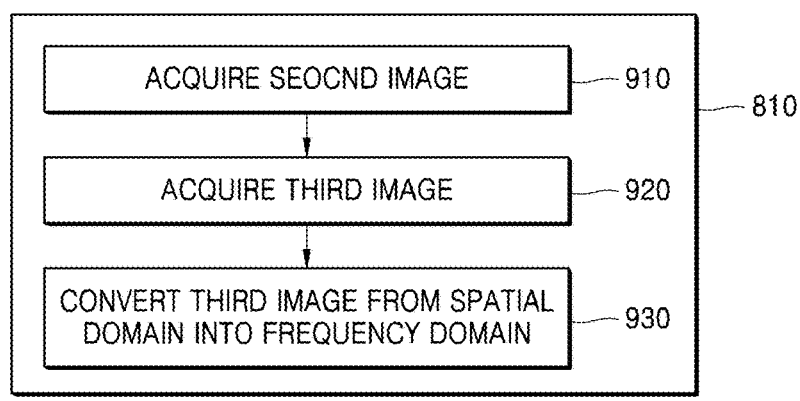
FIG. 9 is a flowchart of an operation of acquiring a second image that is shown in FIG. 8.

FIG. 9 is a flowchart of operation 810 shown in FIG. 8 in more detail.

Referring to FIG. 9, operation 810 includes acquiring a second image (operation 910), acquiring a third image (operation 920), and converting the third image from the spatial domain into the frequency domain (operation 930).

In operation 910, an edge preserving de-noise filter is used to remove noise in the first image while preserving edges thereof. For example, operation 910 may be performed using at least one selected from bilateral filtering, anisotropic filtering, block-matching and 3D filtering, and non-local means filtering. For example, in operation 910, edge preserving de-noising filtering may be performed on the first image acquired in operation 710 to generate a second image having preserved edges and reduced noise.

In operation 920, a third image is generated based on the first and second images. For example, the third image may be acquired by subtracting the second image from the first image. In this case, the third image may be an image including ringing artifacts and various noise.

In operation 930, an image in the spatial domain is converted into an image in the frequency domain. For example, the third image in the spatial domain generated in operation 920 is converted into the frequency domain. The third image converted into the frequency domain may be processed by performing operation 820. Operation 930 may be performed using FT, FFT, and any other transformation techniques for converting pixel values in an image into frequency values.

Figure 10:
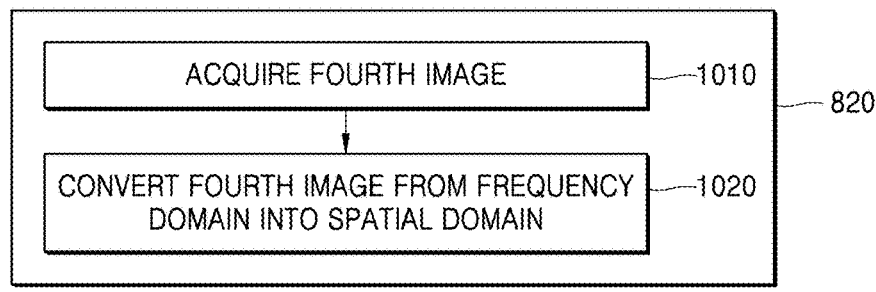
FIG. 10 is a flowchart of an operation of acquiring a fourth image that is shown in FIG. 8.

FIG. 10 is a flowchart of operation 820 shown in FIG. 8 in more detail. In operation 820, an image is processed in the frequency domain. Operation 820 includes acquiring a fourth image (operation 1010), and converting the fourth image from the frequency domain into the spatial domain (operation 1020).

In operation 1010, a low-pass filter is used. The low-pass filter filters out signal values having frequencies above a filtering frequency among signal values in an image while allowing signal values having frequencies less than or equal to the filtering frequency to pass among the signal values in the image. In detail, the low-pass filter receives a third image in the frequency domain, and outputs the fourth image by filtering out signal values having frequencies above a filtering frequency from the third image. In this case, the filtering frequency may be set according to a range of frequencies that is to be filtered by the low-pass filter.

In operation 1020, an image in the frequency domain is converted into an image in the spatial domain. For example, in operation 1020, the fourth image generated in operation 1010 is converted back into the spatial domain, and thus, the fourth image converted into the spatial domain may be generated. The fourth image in the spatial domain may be used for operation 830.

Figure 11:
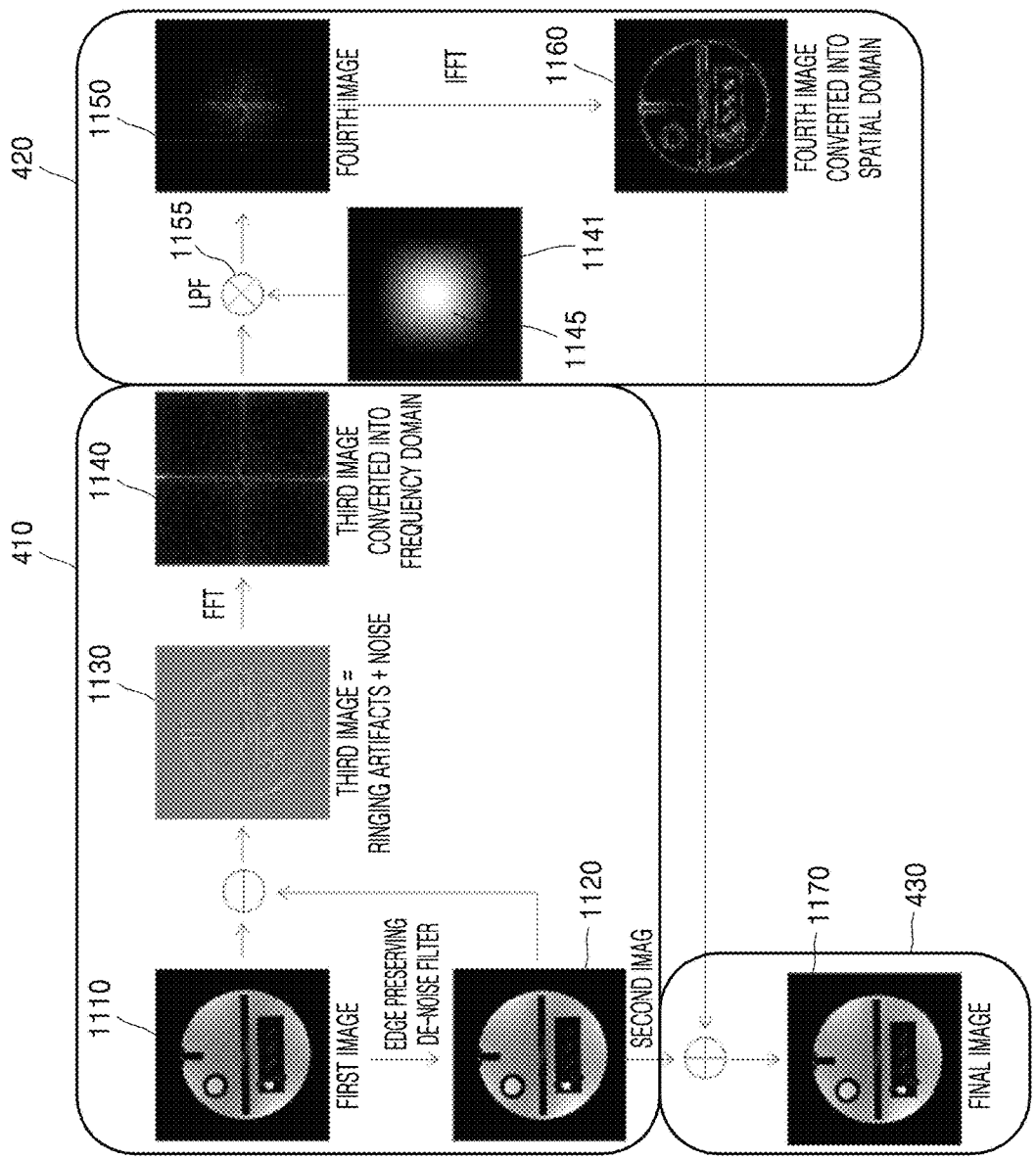
FIG. 11 is a detailed diagram of an MRI apparatus according to an exemplary embodiment.

FIG. 11 is a detailed diagram of an MRI apparatus according to an exemplary embodiment. In particular, FIG. 11 is a detailed diagram of the image acquisition unit (320 of FIG. 3) including the spatial domain processor 410, the frequency domain processor 420, and the final image acquisition unit 430 shown in FIG. 5.

Referring to FIGS. 3, 4, 5, and 11, as described above, a first image 1110 may be acquired by the data acquisition unit 310. The spatial domain processor 410 performs the following processing. An edge preserving de-noise filter processes the first image 1110 to generate a second image 1120. In detail, the first and second images are MR images in the spatial domain. The spatial domain processor 410 subtracts the second image 1120 from the first image 1110 to generate a third image 1130 including ringing artifacts and noise. Furthermore, the third image 1130 is an image in the spatial domain, and an FFT converts the third image 1130 in the spatial domain into a third image 1140 in the frequency domain. The third image 1140 in the frequency domain may be an image in a K-space.

Although FIG. 11 shows that the spatial domain processor 410 performs the above-described processing, exemplary embodiments are not limited thereto. For example, the Fourier Transform may be performed on the third image 1130 by the frequency domain processor 420.

The frequency domain processor 420 performs the following processing. A low-pass filter 1155 converts the third image 1140 in the frequency domain may be converted into a fourth image 1150. The low-pass filter 1155 is a filter for processing frequency domain data or image in the frequency domain. In detail, the low-pass filter 1155 obtains signal values of a central region 1145 including low frequency components of K-space data. The fourth image 1150 is obtained by removing high frequency components 1141 from the third image 1140 in the frequency domain.

Artifacts or noise contain high frequency components. Thus, if low-pass filtering is performed on an image, artifacts or noise present in the image may be removed. However, as the third image 1140 in the frequency domain passes through the low-pass filter 1155, a high-frequency image signal representing an object may be removed from the third image 1140 together with noise present therein. Thus, the fourth image 1150 may be an image of the object in which some details have been lost. An inverse FFT (IFFT) converts the fourth image 1150 in the frequency domain back into a fourth image 1160 in the spatial domain. Although FIG. 11 shows that the frequency domain processor 420 performs the above-described processing, exemplary embodiments are not limited thereto.

The final image acquisition unit 430 performs the following processing. The final image acquisition unit 430 generates a final image based on the second image 1120 and the fourth image 1160 in the spatial domain. In detail, the second image 1120 and the fourth image 1160 in the spatial domain are added together to generate the final image. In detail, the second image 1120 is an image having preserved edges and reduced noise, and the fourth image 1160 in the spatial domain is an image from which noise has been removed. Thus, by adding the second image 1120 and the fourth image 1160 in the spatial domain together, an image having preserved edges and reduced noise may be generated. While FIG. 11 shows that the final image acquisition unit 430 performs the above-described processing, exemplary embodiments are not limited thereto.

Figure 12:
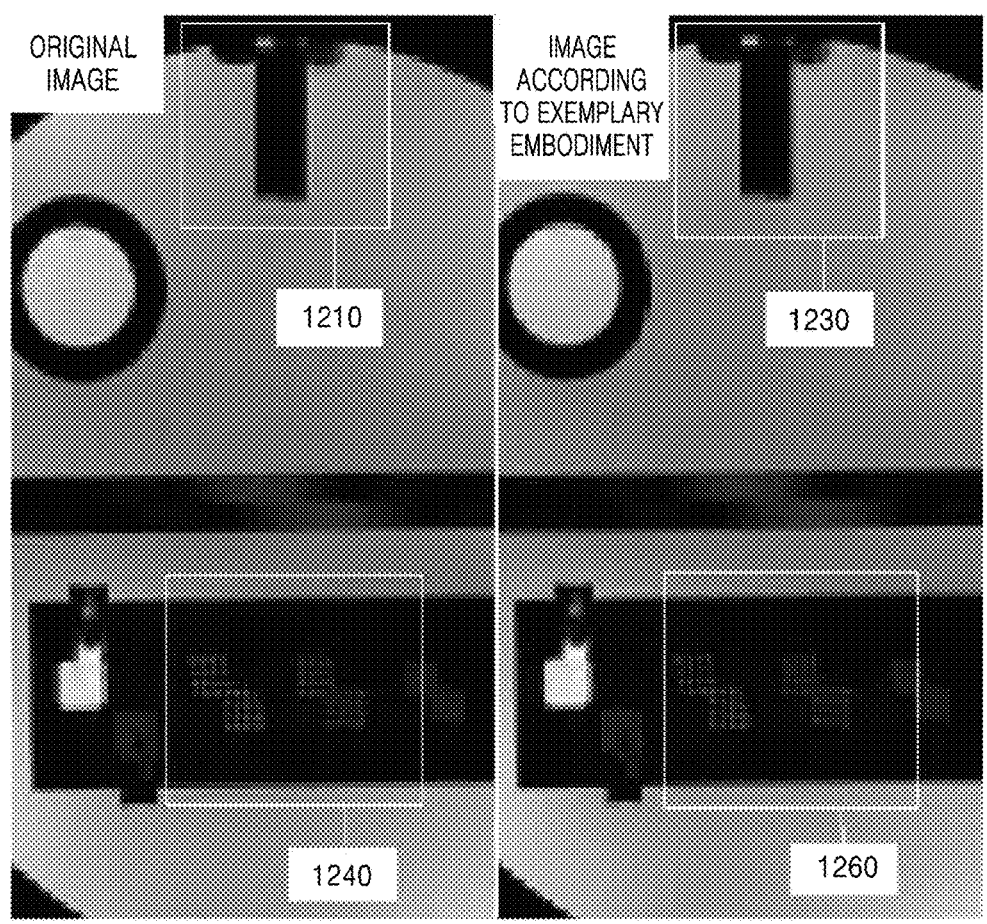
FIG. 12 is an diagram showing a quality of a final MR image generated according to an exemplary embodiment.

FIG. 12 is a diagram showing a quality of a final MR image generated according to an exemplary embodiment. Referring to FIG. 12, ringing artifacts are present in a portion 1210 of an original image, but ringing artifacts in a portion 1230 of the final MR image are effectively removed. Furthermore, by comparing a portion 1240 of the original image with a portion 1260 of the final MR image, it can be seen that the portion 1260 has almost the same sharpness as the portion 1240. In other words, although ringing artifacts in the original image have been removed, the details of the final MR image are almost the same as those of the original image.

Figure 13:
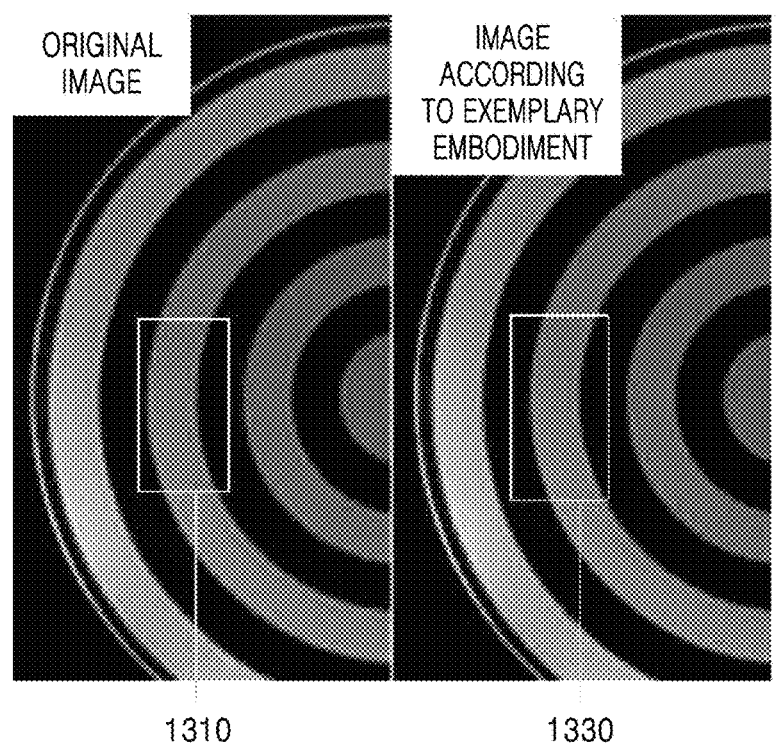
FIG. 13 is another diagram showing a quality of a final MR image generated according to an exemplary embodiment.

FIG. 13 is another diagram showing a quality of a final MR image generated according to an exemplary embodiment. As apparent from FIG. 13, ringing artifacts are present in a portion 1310 of an original image while ringing artifacts in a portion 1330 of the final MR image are sufficiently removed.

TABLE 1

Comparison of signal to noise ratios (SNRs) and peak signal to noise ratios (PSNRs) among an original image, an image generated according to the related art, and an image generated according to an exemplary embodiment

|  | SNR | PSNR |
|---|---|---|
| Original image | 35.44 | — |
| Related art | 37.85 | 47.18 |
| Exemplary embodiment | 42.11 | 51.63 |

Table 1 shows signal to noise ratios (SNRs) and peak signal to noise ratios (PSNRs) of the original image, an image generated according to the related art, and an image generated according to the exemplary embodiment. A higher SNR value means a higher ratio of the strength of a signal carrying information to noise. As shown in Table 1, SNRs of the original image, the image generated according to the related art, and the image generated according to the exemplary embodiment are 35.44, 37.85, and 42.11, respectively. By comparing the SNRs, it can be seen that the image generated according to the exemplary embodiment has a higher SNR than the original image and the image generated according to the related art. Furthermore, the image generated according to the exemplary embodiment has a PSNR of 51.63 that is higher than a PSNR of 47.13 of the image generated according to the related art.

As described above, referring to FIGS. 12 and 13 and Table 1, an MRI apparatus and an MRI method according to exemplary embodiments may preserve edges and details of an image containing important information while removing ringing artifacts. Thus, ringing artifacts may be removed while preventing the loss of a high-frequency region of a medical image. This allows a medical practitioner to provide an accurate diagnosis by viewing an MR image.

In detail, exemplary embodiments propose a method of removing ringing artifacts generated in an MRI apparatus. The method includes obtaining a residual image by using an edge preserving de-noise filter in the spatial domain, and effectively removing ringing artifacts without causing loss of high frequency information of the original image by using a result obtained by performing low-pass filtering in the frequency domain. The method may effectively remove only ringing artifacts while retaining the sharpness of an image, compared to a method according to the related art.

The exemplary embodiments can be recorded as programs that can be executed on a computer and be implemented through digital computers that execute the programs using a computer-readable recording medium. Examples of the computer-readable recording medium include magnetic storage media (e.g., ROM, floppy disks, hard disks, etc.), optical recording media (e.g., CD-ROMs or DVDs), carrier waves (e.g., transmission through the Internet), etc.

The foregoing exemplary embodiments and advantages are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance imaging (MRI) apparatus comprising:
at least one hardware processor implementing:
a data acquisition unit configured to acquire a first image, based on an MRI scan on an object; and
an image acquisition unit configured to:
acquire a second image by performing de-noising filtering on the first image in a spatial domain;
acquire a third image, based on the first image and the second image;
convert the third image from the spatial domain into a frequency domain;
acquire a fourth image by performing low-pass filtering on the third image converted into the frequency domain;
convert the fourth image from the frequency domain into the spatial domain; and
acquire a final image, based on the second image and the fourth image converted into the spatial domain.

2. The MRI apparatus of claim 1, wherein the de-noising filtering is edge preserving de-noising filtering, and
the image acquisition unit comprises a spatial domain processor configured to acquire the second image by performing the edge preserving de-noising filtering on the first image in the spatial domain.

3. The MRI apparatus of claim 2, wherein the edge preserving de-noising filtering comprises any one or any combination of bilateral filtering, anisotropic filtering, block-matching and three-dimensional filtering, and non-local means filtering.

4. The MRI apparatus of claim 2, wherein the spatial domain processor comprises:
an edge preserving de-noise filter configured to perform the edge preserving de-noising filtering on the first image in the spatial domain to acquire the second image;
a residual image acquisition unit configured to acquire the third image, based on the first image and the second image; and
a domain transform unit configured to convert the third image from the spatial domain into the frequency domain.

5. The MRI apparatus of claim 4, wherein the residual image acquisition unit is further configured to acquire the third image by subtracting the second image from the first image.

6. The MRI apparatus of claim 4, wherein the domain transform unit is further configured to apply a Fourier transform or a Fast Fourier transform to the third image to convert the third image from the spatial domain into the frequency domain.

7. The MRI apparatus of claim 4, wherein the image acquisition unit further comprises a frequency domain processor configured to acquire the fourth image by performing the low-pass filtering on the third image converted into the frequency domain to remove ringing artifacts in the third image converted into the frequency domain.

8. The MRI apparatus of claim 7, wherein the frequency domain processor comprises:
a low-pass filter configured to perform the low-pass filtering on the third image converted into the frequency domain to acquire the fourth image; and a domain inverse transform unit configured to convert the fourth image from the frequency domain into the spatial domain.

9. The MRI apparatus of claim 8, wherein the image acquisition unit further comprises a final image acquisition unit configured to acquire the final image by adding the second image and the fourth image converted into the spatial domain.

10. A magnetic resonance imaging (MRI) apparatus comprising:
a data acquisition unit configured to acquire a first image based on an MRI scan on an object; and
an image acquisition unit configured to
acquire a second image by performing first filtering on the first image in a spatial domain,
acquire a third image by subtracting the second image from the first image,
convert the third image from the spatial domain into a frequency domain,
acquire a fourth image by performing second filtering on the third image converted into the frequency domain,
convert the fourth image from the frequency domain into the spatial domain, and
acquire a final image based on the second image and the fourth image converted into the spatial domain,
wherein the second filtering is low-pass filtering.

11. The MRI apparatus of claim 10, wherein the first filtering is edge preserving de-noising filtering.

12. A magnetic resonance imaging (MRI) method comprising:
acquiring a first image based on an MRI scan on an object;
acquiring a second image by performing de-noising filtering on the first image in a spatial domain;
acquiring a third image based on the first image and the second image;
converting the third image from the spatial domain into a frequency domain;
acquiring a fourth image by performing low-pass filtering on the third image converted into the frequency domain;
converting the fourth image from the frequency domain into the spatial domain; and
acquiring a final image based on the second image and the fourth image converted into the spatial domain.

13. The MRI method of claim 12, wherein the acquiring the second image comprises acquiring the second image by performing edge preserving de-noising filtering on the first image in the spatial domain.

14. The MRI method of claim 13, wherein the edge preserving de-noising filtering comprises any one or any combination of bilateral filtering, anisotropic filtering, block-matching and three-dimensional filtering, and non-local means filtering.

15. The MRI method of claim 12, wherein the acquiring the third image comprises acquiring the third image by subtracting the second image from the first image.

16. The MRI method of claim 12, wherein the acquiring the third image comprises converting the third image from the spatial domain into the frequency domain.

17. The MRI method of claim 16, wherein the converting the third image comprises applying a Fourier transform or Fast Fourier transform to the third image.

18. The MRI method of claim 16, wherein the acquiring the fourth image comprises:
acquiring the fourth image by performing the low-pass filtering on the third image converted into the frequency domain.

19. The MRI method of claim 18, wherein the acquiring the final image comprises acquiring the final image by adding the second image and the fourth image converted into the spatial domain.

20. The MRI method of claim 12, wherein the acquiring the fourth image comprises acquiring the fourth image by performing the low-pass filtering on the third image in the frequency domain to remove ringing artifacts in the third image.

21. A non-transitory computer-readable storage medium storing a program comprising instructions to cause a computer to perform the method of claim 12.

22. A magnetic resonance imaging (MRI) apparatus comprising:
a spatial domain processor configured to:
filter an MRI image in a spatial domain to generate a first filtered image,
generate a ringing artifacts image based on the first filtered image and the MRI image, and
convert the ringing artifacts image from the spatial domain into a frequency domain;
a frequency domain processor configured to:
perform low-pass filtering on the ringing artifacts image in the frequency domain to generate a second filtered image, and
convert the second filtered image from the frequency domain into the spatial domain; and
a final image acquisition unit configured to acquire a final image based on the first filtered image and the second filtered image converted into the spatial domain.

23. The MRI apparatus of claim 22, wherein the spatial domain processor is configured to:
perform edge preserving de-noise filtering on the MRI image in the spatial domain to generate the first filtered image; and
subtract the first filtered image from the MRI image to generate the ringing artifacts image.

* * * * *